United States Patent
Kiribuchi et al.

(10) Patent No.: US 11,218,085 B2
(45) Date of Patent: Jan. 4, 2022

(54) POWER CONVERSION DEVICE HAVING AN INVERTER CIRCUIT INCLUDING CURRENT LIMITATION CIRCUITS AND A CONTROL CIRCUIT CONTROLLING SAME

(71) Applicant: OMRON Corporation, Kyoto (JP)

(72) Inventors: Takeshi Kiribuchi, Osaka (JP); Satoshi Miyagawa, Kyoto (JP); Hitoshi Fukuhara, Ritto (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 16/643,608

(22) PCT Filed: Mar. 6, 2019

(86) PCT No.: PCT/JP2019/008853
§ 371 (c)(1),
(2) Date: Mar. 2, 2020

(87) PCT Pub. No.: WO2019/188069
PCT Pub. Date: Oct. 3, 2019

(65) Prior Publication Data
US 2020/0212824 A1  Jul. 2, 2020

(30) Foreign Application Priority Data

Mar. 30, 2018 (JP) .............................. JP2018-069061

(51) Int. Cl.
*H02M 7/5387* (2007.01)
*H02M 1/08* (2006.01)
(Continued)

(52) U.S. Cl.
CPC ......... *H02M 7/53871* (2013.01); *H02M 1/08* (2013.01); *H02P 27/08* (2013.01); *H02M 1/0009* (2021.05); *H02M 5/4585* (2013.01)

(58) Field of Classification Search
CPC .. H02M 7/53871; H02M 1/08; H02M 5/4585; H02M 2001/0009; H02P 27/08
See application file for complete search history.

(56) References Cited

U.S. PATENT DOCUMENTS

| 2011/0234176 A1 * | 9/2011 | Nakamura | ........ H02M 7/53871 320/166 |
| 2014/0146426 A1 | 5/2014 | Murakami | |
| 2014/0253182 A1 | 9/2014 | Hironori et al. | |

FOREIGN PATENT DOCUMENTS

| CN | 105379086 A | * 3/2016 | .............. H02M 1/08 |
| CN | 107947538 A | * 4/2018 | .............. H02M 1/32 |

(Continued)

OTHER PUBLICATIONS

English translation of the International Search Report("ISR") of PCT/JP2019/008853 dated Apr. 23, 2019.
(Continued)

*Primary Examiner* — Kyle J Moody
*Assistant Examiner* — Jye-June Lee
(74) *Attorney, Agent, or Firm* — Metrolex IP Law Group, PLLC

(57) ABSTRACT

The power conversion device includes an inverter circuit in which one or a plurality of current limitation circuits that limit an electric current flowing in each of legs are provided and a control unit that controls, when a target voltage or a target current of the inverter circuit is outside a predetermined range, the current limitation circuits such that the electric current flowing in each of the legs is not limited and alternately performs the ON/OFF control of the two switching elements of each of the legs with a dead time in between and controls, when the target voltage or the target current is within the predetermined range, the current limitation circuits such that the electric current flowing in each of the legs is limited and alternately performs the ON/OFF control the
(Continued)

two switching elements of each of the legs of the inverter circuit without the dead time in between.

7 Claims, 10 Drawing Sheets

(51) Int. Cl.
*H02P 27/08* (2006.01)
*H02M 5/458* (2006.01)
*H02M 1/00* (2006.01)

(56) References Cited

FOREIGN PATENT DOCUMENTS

| | | |
|---|---|---|
| JP | H05-090928 A | 4/1993 |
| JP | 2007-267560 A | 10/2007 |
| JP | 2010-110071 A | 5/2010 |
| JP | 2015-166870 A | 9/2015 |
| JP | 2016-111776 A | 6/2016 |
| JP | 2016-187296 A | 10/2016 |
| WO | 2017/025993 A1 | 2/2017 |

OTHER PUBLICATIONS

English translation of the Written Opinion("WO") of PCT/JP2019/008853 dated Apr. 23, 2019.
Wada Keilji et al, "Design and implementation of a 500 kHz switching PWM inverter without a dead-time", Jun. 1, 2015, pp. 2175-2179, 2015 9th International Conference on Power Electronics and ECCE Asia, Korean Institute of Power Electronics; Relevance is indicated in the EESR mailed on Nov. 3, 2021.
Bin Zhang et al, "A novel IGBT gate driver to eliminate the dead-time effect", vol. 2, pp. 813-817, Conference Record of the 2005 IEEE Industry Applications Conference Fortieth IAS Annual Meeting Oct. 2-6, 2005 Kowloon, Hong Kong, China IEEE; Relevance is indicated in the EESR mailed on Nov. 3, 2021.
Yong-Kai Lin et al, "Dead-Time Elimination of PWM-Controlled Inverter/Converter Without Separate Power Sources for Current Polarity Detection Circuit", vol. 56, No. 6, Jun. 1, 2009, pp. 2121-2127, IEEE Transactions on Industrial Electronics, IEEE Service Center, Piscataway, NJ, USA; Relevance is indicated in the EESR mailed on Nov. 3, 2021.
Shihong Park et al, "An augmented phase-leg configumration with shoot-through immunity and improvements for high-current opetarion", vol. 1, Feb. 22, 2004, pp. 102-108, 2004 IEEE Applied Power Electronics Conference and Exposition, APEC 04, IEEE, Anaheim, CA, USA; Relevance is indicated in the EESR mailed on Nov. 3, 2021.
Extended European Search report ("EESR") dated Nov. 3, 2021 in corresponding EP 19775259.

* cited by examiner

POWER CONVERSION DEVICE HAVING AN INVERTER CIRCUIT INCLUDING CURRENT LIMITATION CIRCUITS AND A CONTROL CIRCUIT CONTROLLING SAME

TECHNICAL FIELD

The present invention relates to a power conversion device and an inverter circuit.

BACKGROUND ART

DC power is converted into AC power by performing PWM (pulse width modulation) control of an inverter circuit including a plurality of legs. But, a switching element (an IGBT or the like) configuring each of the legs has a switching delay time. Therefore, when two switching elements of each of the legs are simultaneously turned on/off, a period in which each of the legs are short-circuited (a period in which both the two switching elements are on) occurs. In such a period, an excessively large current flows to each of the switching elements. Therefore, during the PWM control of the inverter circuit, a dead time is inserted into a control signal for the two switching elements of each of the legs (see, for example, Patent document 1).

CITATION LIST

Patent Document

Patent document 1: Japanese Patent Laid-open No. 2016-111776

SUMMARY OF THE INVENTION

Technical Problem

When the dead time is inserted, an output voltage drops or a dead band occurs, by the length of the dead time. However, during the PWM control of the inverter circuit, voltage or current feedback control is performed for matching an output voltage or current with a target value. Therefore, even if the dead time is set, the output voltage or current can be finally set to the target value. However, since a deviation in feedback is small during a low output, it takes time for an output to reach the target value. Therefore, with the conventional PWM control having the dead time, it has been difficult to control a power conversion device and an inverter with high responsiveness during a low output. On the other hand, to eliminate the dead time and improve the responsiveness, linear control for the inverter circuit needs to be performed rather than switching. In particular, in the case of an operation with large power, a loss of the circuit is large to be inefficient, or an apparatus increases in size to be practically difficult.

The present invention has been made in view of the present situation described above, and an object of the present invention is to provide a power conversion device that can output low-output AC power with high responsiveness and has high efficiency even during a large output, and an inverter circuit that can be used as a component of such a power conversion device.

Means for Solving the Problems

In order to achieve the object, a power conversion device according to an aspect of the present invention includes: an inverter circuit including one or more legs in which two switching elements are connected in series; and a control unit that performs ON/OFF control of each of the switching elements in the inverter circuit. In the inverter circuit of the power conversion device, one or a plurality of current limitation circuits that limit an electric current flowing in each of the one or more legs are provided. When a target voltage or a target current, which the control unit of the power conversion device should cause the inverter circuit to output, is outside a predetermined range, the control unit of the power conversion device controls the one or the plurality of current limitation circuits such that the electric current flowing in each of the one or more legs is not limited and alternately performs the ON/OFF control of the two switching elements of each of the one or more legs of the inverter circuit with a dead time in between. When the target voltage or the target current is within the predetermined range, the control unit of the power conversion device controls the one or the plurality of current limitation circuits such that the electric current flowing in each of the one or more legs is limited and alternately performs the ON/OFF control of the two switching elements of each of the one or more legs of the inverter circuit without the dead time in between.

That is, the power conversion device according to the aspect of the present invention has a configuration in which the two switching elements of each of the one or more legs of the inverter circuit are turned on/off without the dead time in between during a low output, an excessively large current being suppressed, by the one or the plurality of current limitation circuits, from flowing to each of the one or more legs according to such control. Therefore, with the power conversion device, it is possible to output low-output AC power with high responsiveness and efficiently convert electric power even during a large output.

A configuration in which the current limitation circuit is provided in a bus of the inverter circuit may be adopted, or a configuration in which, for each of the one or more legs of the inverter circuit, the one or the plurality of current limitation circuits that limit the electric current flowing in each of the one or more legs is provided may be adopted in the power conversion device.

When the latter configuration is adopted in the power conversion device, a configuration in which "the one or the plurality of current limitation circuits that limit the electric current flowing in each of the one or more legs are circuit that adjust a gate voltage or a base current of one switching element of a leg set as a control target for an electric current to limit the electric current flowing in the leg, and the control unit controls, when the target voltage or the target current is within the predetermined range, the current limitation circuit such that the electric current flowing in the one switching element is equal to or smaller than a predetermined current when the one switching element is on, and controls, when the target voltage or the target current is outside the predetermined range, the current limitation circuit such that the electric current flowing in the one switching element is not limited to the predetermined current or less when the one switching element is on" may be further adopted.

When this configuration is adopted, to prevent a through-current from flowing even if response speed of the current limitation circuit is low, a configuration in which "when the target voltage or the target current is within the predetermined range, when the one switching element is turned on, the control unit controls the current limitation circuit such that the gate voltage or the base current of the one switching element starts to rise in a rising pattern and at a rising start timing decided on the basis of response speed of the current limitation circuit and before an ON timing for the one switching element" may be adopted.

In the power conversion device, a configuration in which "the one switching element is a switching element with current sense and the current limitation circuit is a circuit that limits, on the basis of an electric current flowing in a current sense terminal of the one switching element, the electric current flowing in the leg" may be adopted.

An inverter circuit according to an aspect of the present invention is an inverter circuit for converting DC power into AC power, the inverter circuit including: one or more legs in which two switching elements are connected in series; and one or a plurality of current limitation circuits that limit an electric current flowing in each of the one or more legs, wherein when a target voltage or a target current which cause the inverter circuit to output is outside a predetermined range, the one or the plurality of current limitation circuits are controlled such that the electric current flowing in each of the one or more legs is not limited and the ON/OFF control of the two switching elements of each of the one or more legs of the inverter circuit is alternately performed with a dead time in between, and when the target voltage or the target current is within the predetermined range, the one or the plurality of current limitation circuits are controlled such that the electric current flowing in each of the one or more legs is limited and the ON/OFF control of the two switching elements of each of the one or more legs of the inverter circuit is alternately performed without the dead time in between. Therefore, if this inverter circuit is used, it is possible to realize a power conversion device that can output low-output AC power with high responsiveness.

Advantageous Effects of the Invention

According to the present invention, it is possible to provide a power conversion device that can output low-output AC power with high responsiveness and efficiently convert electric power even during a large output and an inverter circuit that can be used as a component of such a power conversion device.

DESCRIPTION OF EMBODIMENTS

Embodiments of the present invention are explained below with reference to the drawings.

First Embodiment

Figure 1:
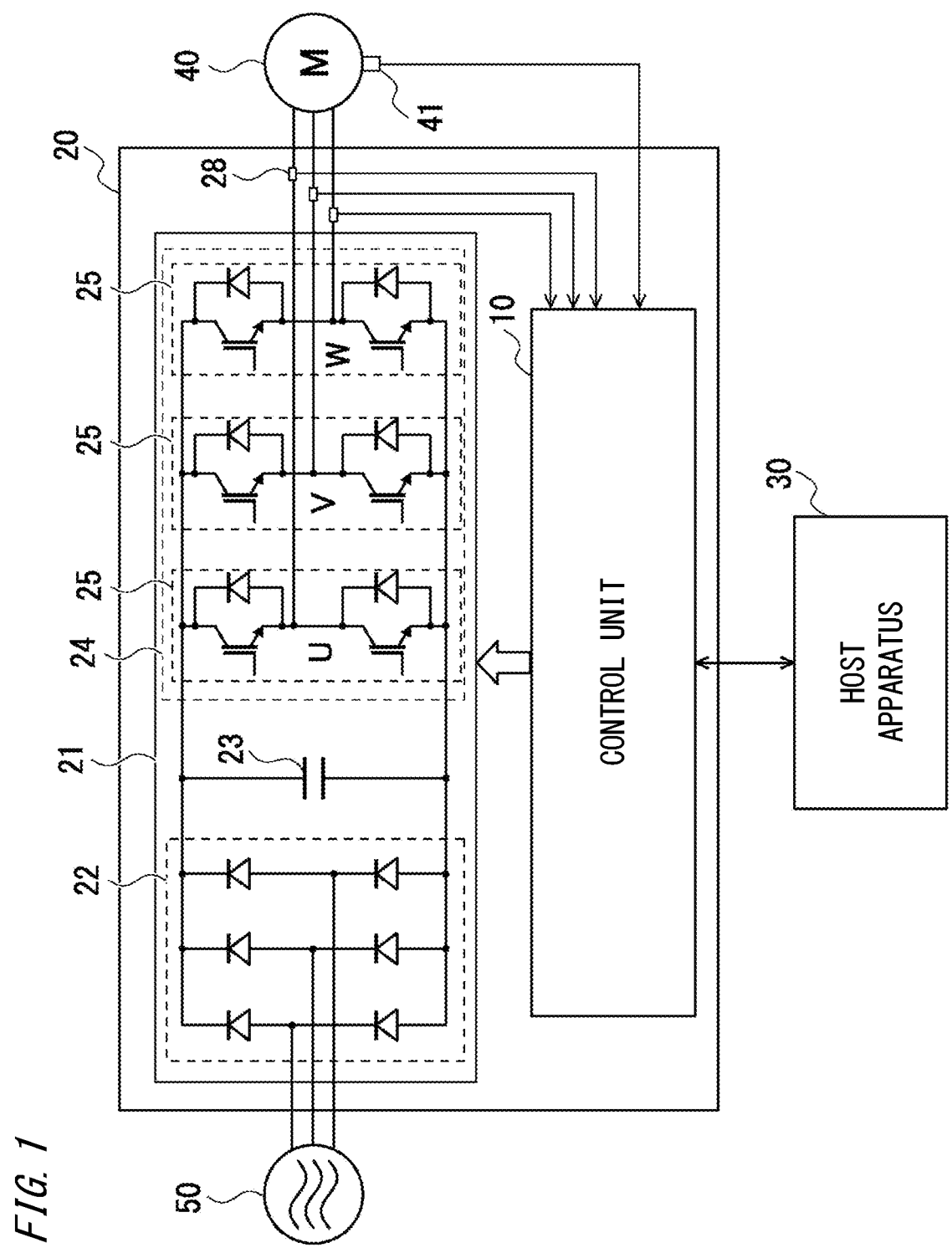
FIG. 1 is an explanatory diagram of a schematic configuration and a form of use of a power conversion device according to a first embodiment of the present invention.

A schematic configuration and a form of use of a power conversion device 20 according to a first embodiment of the present invention are illustrated in FIG. 1. The power conversion device 20 according to this embodiment is an apparatus for driving a motor (a three-phase motor) 40. As illustrated, the power conversion device 20 includes a power circuit 21 and a control unit 10.

The power circuit 21 is a circuit for generating a three-phase alternating current to supply to the motor 40. As illustrated, the power circuit 21 includes a rectification circuit 22 for rectifying a three-phase alternating current supplied from a three-phase power supply 50 and a smoothing capacitor 23. Further, the power circuit 21 includes an inverter circuit 24 for converting an output voltage of the rectification circuit 22 smoothed by the smoothing capacitor 23 into a three-phase alternating voltage.

The inverter circuit 24 is a circuit in which a leg 25 for a U phase, a leg 25 for a V phase, and a leg 25 for a W phase are connected in parallel between positive and negative buses. The detail will be explained below, each of the legs 25 of the inverter circuit 24 are configured by two switching elements connected in series and a current limitation circuit (not illustrated) for limiting the magnitude of an electric current flowing in the own leg 25. Note that, in FIG. 1, IGBTs (Insulated Gate Bipolar Transistors) are illustrated as each of the switching elements. Each of the switching elements configuring each of the legs 25 may be switching elements (MOS-FETs, bipolar transistors, or the like) other than the IGBTs.

In the power conversion device 20, current sensors 28 for measuring output currents of each of the legs 25 of the inverter circuit 24 are provided. Measurement results of output currents in the U, V, and W phases by each of the current sensors 28 are respectively described as U-phase current measurement value, V-phase current measurement value, and W-phase current measurement value.

The control unit 10 is a unit that controls the inverter circuit 24 according to an instruction from a host apparatus 30 such as a PLC (Programmable logic controller). The control unit 10 is configured from a processor and its peripheral circuit. Signals from each of the current sensors 28, a signal from an encoder 41 (an absolute encoder or an incremental encoder) attached to the motor 40, and the like are input to the control unit 10.

The configuration of the power conversion device 20 is more specifically explained below.

First, a circuit configuration of each of the legs 25 of the inverter circuit 24 is explained. Note that, in the following explanation, for convenience of explanation, a switching element on a high side and a switching element on a low side of each of the legs 25 are respectively described as first switching element and second switching element.

Figure 2:
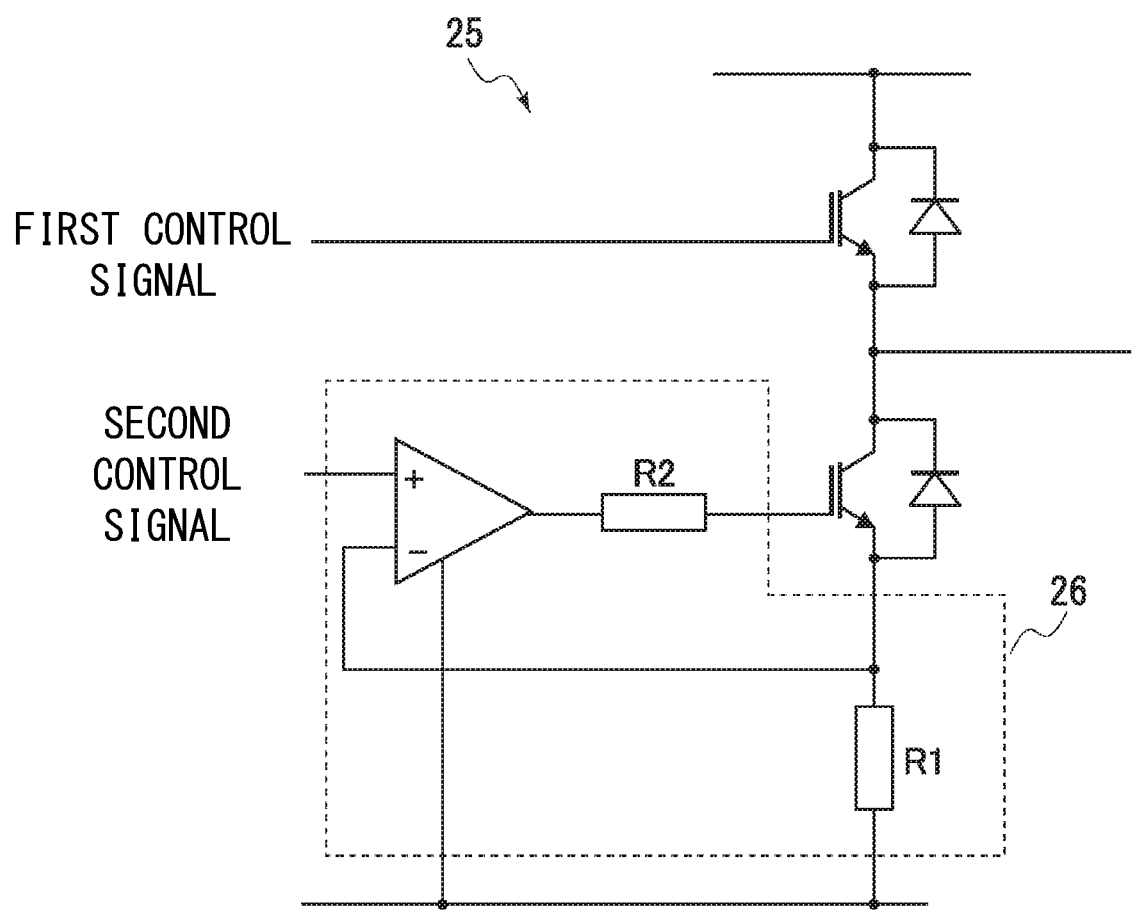
FIG. 2 is an explanatory diagram of a circuit configuration of each of legs of an inverter circuit included in the power conversion device according to the first embodiment.

In FIG. 2, a circuit configuration of each of the legs 25 of the inverter circuit 24 according to this embodiment is illustrated. As illustrated, each of the legs 25 of the inverter circuit 24 form basically a unit (a circuit) in which two switching elements are connected in series. However, in each of the legs 25, a current limitation circuit 26, configured by an operational amplifier, a resistor R1, and a resistor R2 for applying a voltage to a gate electrode of the second switching element, is provided. A resistance value of the resistor R1 is also hereinafter described as R1.

As it is evident from the illustrated circuit configuration, the current limitation circuit 26 is a circuit that limits a value of an electric current flowing in the second switching element to Vin/R1 by adjusting an applied voltage to a second gate electrode such that a voltage Vin input as a second control signal and a voltage between both ends of the resistor R1 coincide. Note that the resistor R2 in the current limitation circuit 26 is a resistor for preventing an overcurrent from flowing. Therefore, the resistor R2 may be omitted.

Then, a control content for the inverter circuit 24 by the control unit 10 (FIG. 1) is explained.

Figure 3:
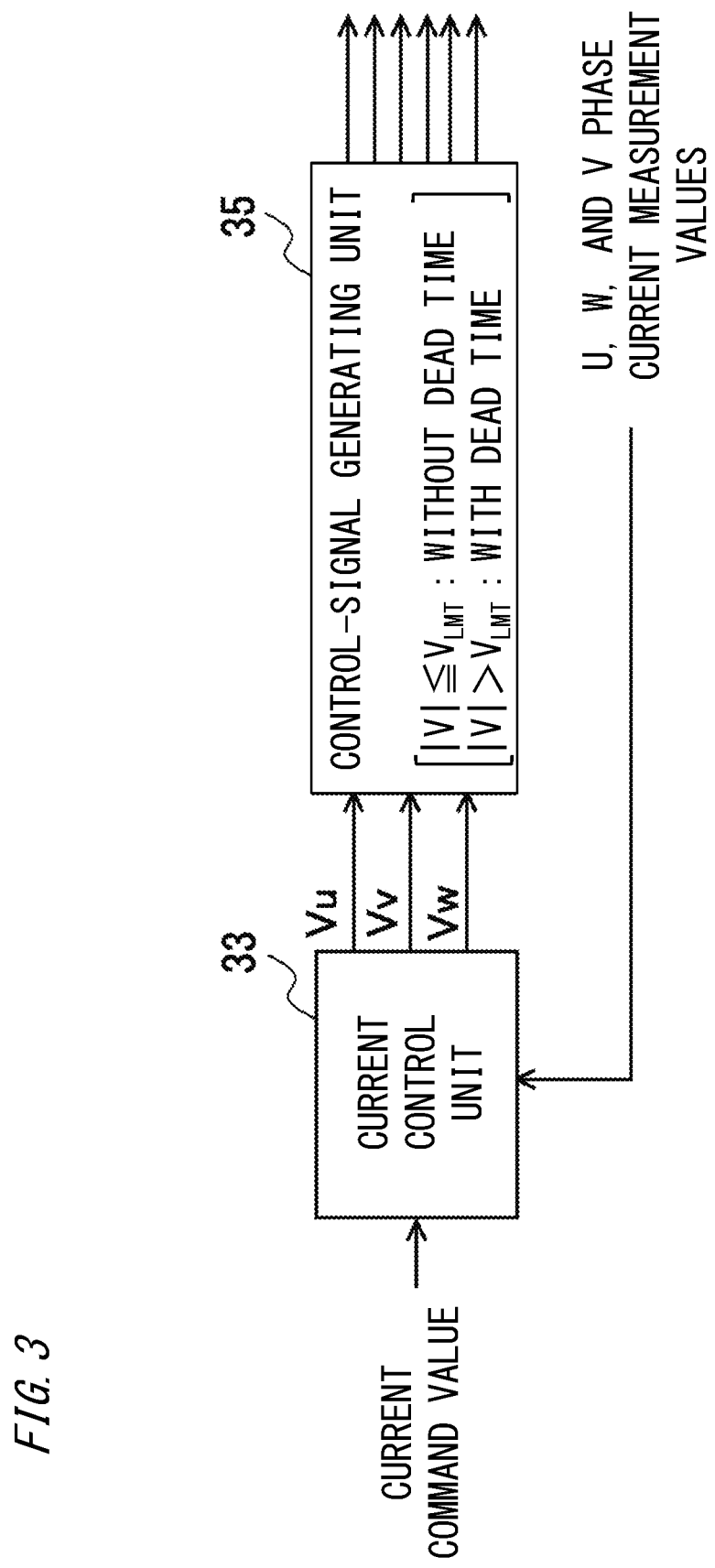
FIG. 3 is a functional block diagram of a control unit included in the power conversion device according to the first embodiment.

In FIG. 3, a functional block diagram of the control unit 10 is illustrated.

As illustrated, the control unit 10 is configured to operate as a current control unit 33 and a control-signal generating unit 35.

The current control unit 33 is a unit (a functional block) that generates a voltage command value Vu for the U phase, a voltage command value Vv for the V phase, and a voltage command value Vw for the W phase on the basis of a current command value, a U-phase current measurement value, a V-phase current measurement value, and a W-phase current measurement value.

More specifically, the current control unit 33 generates the current command values for each of the phases on the basis of the current command value and generates voltage command values for each of the phases according to a PI arithmetic operation for a deviation between the generated current command values for each of the phases and the current measurement values for each of the phases. Note that the current command value input to the current control unit 33 may be a value itself input from the host apparatus 30 or may be a value generated in the control unit 10 on the basis of information and an instruction input from the host apparatus 30.

The control-signal generating unit 35 is a unit that generates, on the basis of the voltage command values (Vu, Vv, and Vw) for each of the phases from the current control unit 33, a control signal for performing ON/OFF control for each of the switching elements in the inverter circuit 24.

A first control signal generated by the control-signal generating unit 35 to control the first switching element of each of the legs 25 is a normal PWM signal supplied to the gate electrode of the first switching element of each of the legs 25. On the other hand, a second control signal generated by the control-signal generating unit 35 to control the second switching element of each of the legs 25 is a signal (see FIG. 2) supplied to the operational amplifier in the current limitation circuit 26 of each of the legs 25. The control-signal generating unit 35 is configured to change a generation algorithm for the first and second control signals on the basis of the voltage command values V (Vu, Vv, or Vw).

Figure 4:
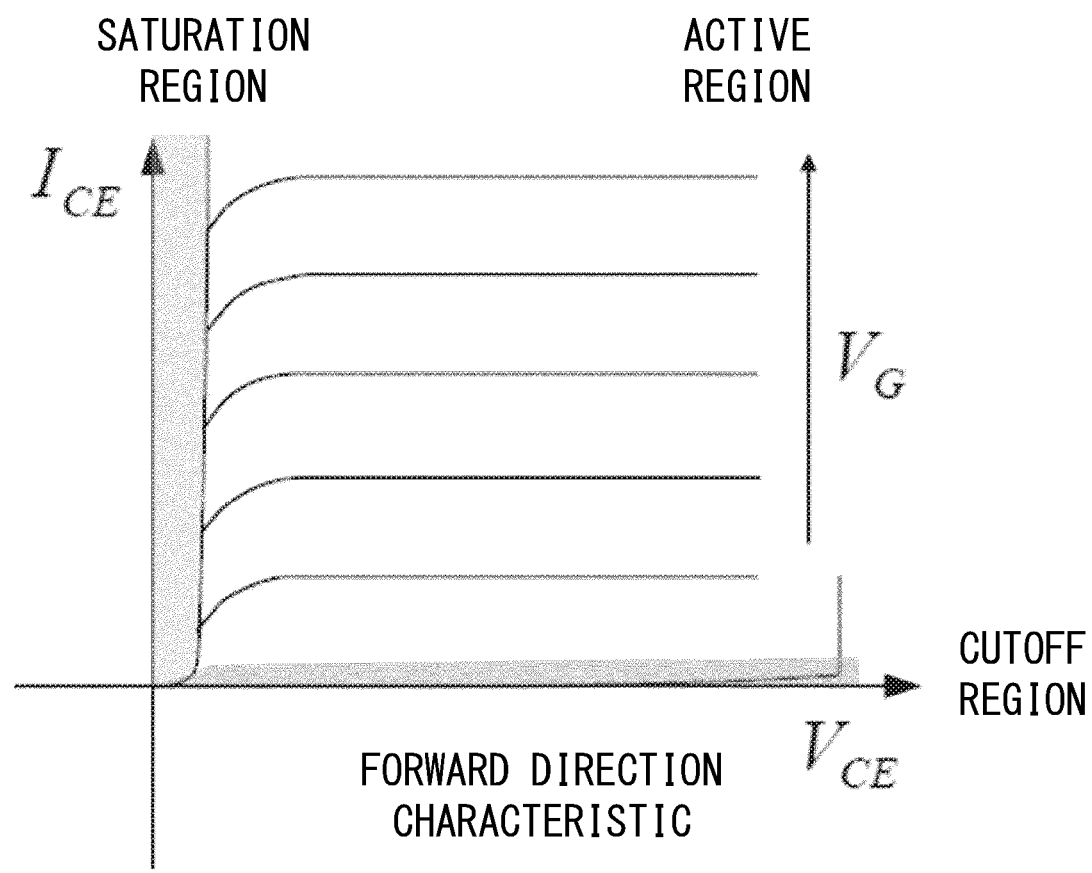
FIG. 4 is an explanatory diagram of a forward direction characteristic of an IGBT.

Specifically, when a voltage command value V is a value equal to or larger than $-V_{LMT}$ and equal to or smaller than $V_{LMT}$, the control-signal generating unit 35 generates the first and second control signals without a dead time in between (not inserted) on the basis of the voltage command value V. In this case, the control-signal generating unit 35 controls a level (a voltage value) of the second control signal in turning on the second switching element to a level at which only an electric current having a current value (hereinafter described as specified current value) decided in advance as an allowable value of a short-circuit current flows in the second switching element in an ON state. More specifically, the IGBT has a forward direction characteristic illustrated in FIG. 4. The control unit 10 controls a gate voltage of the IGBT (the second switching element) via the current limitation circuit 26 such that an active region of the IGBT (the second switching element) is used and a collector current ($I_{CE}$) of the IGBT (the second switching element) is equal to or smaller than the specified current value.

On the other hand, when the voltage command value V is not the value equal to or larger than $-V_{LMT}$ and equal to or smaller than $V_{LMT}$, the control-signal generating unit 35 generates the first and second control signals with a dead time in between on the basis of the voltage command value V. In this case, the control-signal generating unit 35 controls the level of the second control signal in turning on the second switching element to a level at which a value of an electric current flowing in the second switching element is not limited by the current limitation circuit 26. That is, the control-signal generating unit 35 controls the gate voltage of the IGBT (the second switching element) via the current limitation circuit 26 such that a saturation region (see FIG. 4) of the IGBT (the second switching element) is used and a sufficient current flows to the IGBT (the second switching element).

As explained above, the current limitation circuit 26 capable of limiting a value of an electric current flowing in each of the legs 25 is provided in each of the legs 25 of the inverter circuit 24 included in the power conversion device 20 according to this embodiment.

When a target output voltage of each of the legs 25 (a voltage command value for each of the phases) is not within a predetermined voltage range (within a range of $-V_{LMT}$ to $V_{LMT}$), the control unit 10 (the control-signal generating unit 35) included in the power conversion device 20 alternately turns on and off the first switching element and the second switching element with a dead time in between without particularly imposing limitation on a value of an electric current flowing in the second switching element in the ON state (hereinafter described as ON current value).

Figure 5:
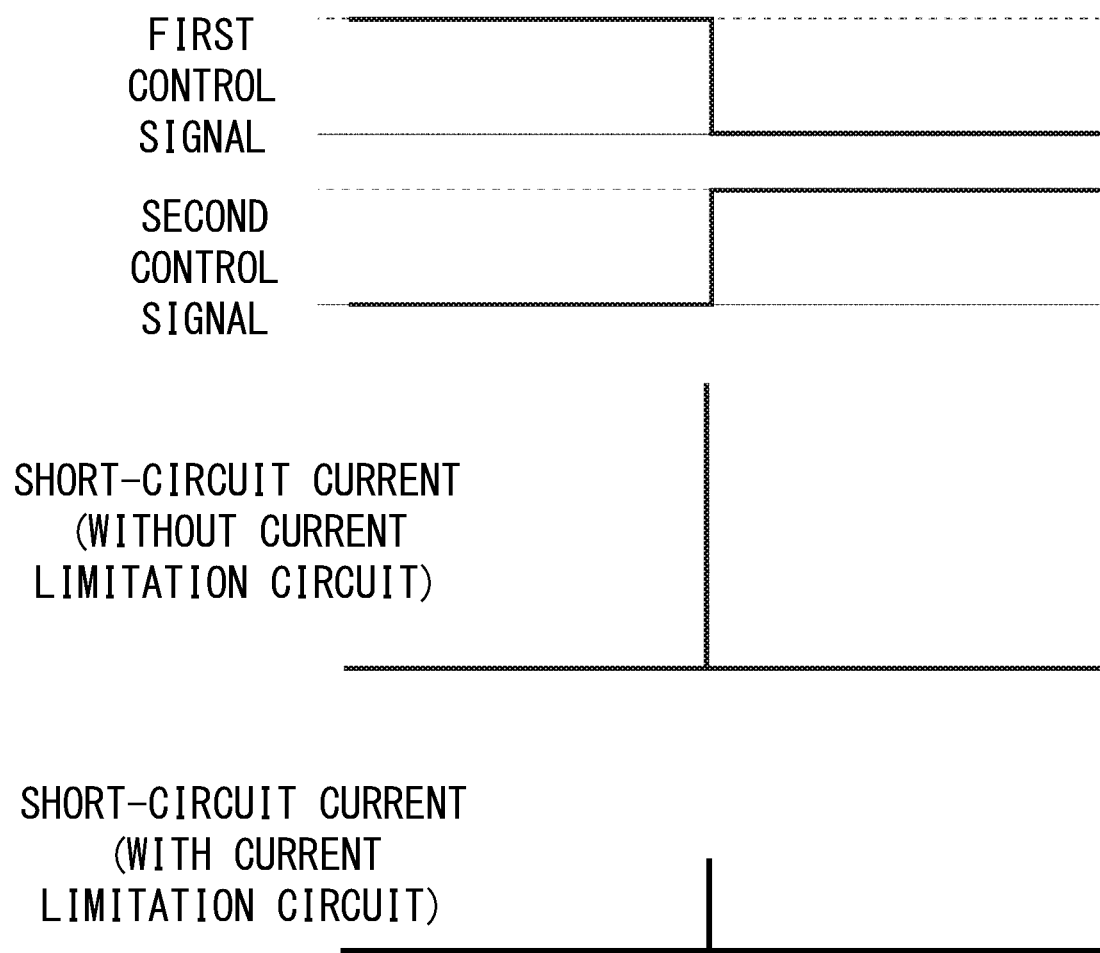
FIG. 5 is a diagram for explaining a function of the power conversion device according to the embodiment.

Further, when the target output voltage is within the predetermined voltage range, the control unit 10 generates the second control signal at a level at which the ON current value is equal to or smaller than the specified current value and alternately turns on and off the first switching element and the second switching element without a dead time in between. As schematically illustrated in FIG. 5, when control signals for the two switching element in a certain leg 25 are simultaneously changed, if the current limitation circuit 26 is not provided in the leg 25, a large short-circuit current flows. However, if the current limitation circuit 26 is provided in the leg 25, the magnitude of a short-circuit current can be reduced to a level at which a problem does not occur. More specifically, when the second switching element transitions from OFF to ON, an electric current flowing in the second switching element is directly limited by the current limitation circuit 26. When the first switching element transitions from OFF to ON (that is, the second switching element changes from ON to OFF), even if a large current is about to flow to the first switching element, since the second switching element is about to transition from ON to OFF, an electric current equal to or more than the limit of electric current by the current limitation circuit 26 does not flow.

If the two switching elements of each of the legs 25 are turned on and off without a dead time in between, it is possible to control the inverter circuit 24 in a form without an output decrease due to the dead time.

Therefore, this power conversion device 20 functions as an device that can output low-output AC power with high responsiveness and has high efficiency even during a large output.

Second Embodiment

The power conversion device 20 according to a second embodiment of the present invention is explained using the same reference numerals and symbols used in the explanation of the power conversion device 20 in the first embodiment. Note that, in the following explanation, the power conversion control 20 according to an N-th (N=1 and 2) embodiment and the control unit 10 of the power conversion device 20 are respectively described as N-th power conversion device 20 and N-th control unit 10 as well.

In the first power conversion device 20 explained above, when response speed of the current limitation circuit 26 of each of the legs 25 is not sufficiently high, there is a risk that a value of an electric current flowing in the second switching element could not be limited and a short-circuit current exceeding the specified current value flows to each of the legs 25. The second power conversion device 20 is obtained by improving the first power conversion device 20 such that a short-circuit current exceeding the specified current value does not flow to each of the legs 25 even if the response speed of the current limitation circuit 26 of each of the legs 25 is low.

In detail, the second power conversion device 20 (the second power conversion device 20 according to the second embodiment) has the same hardware configuration as the first power conversion device 20. When the target output voltage of each of the legs 25 is not within the predetermined voltage range, like the first control unit 10, the second control unit 10 (the control unit 10 of the second power conversion device 20) alternately turns on and off the first switching element and the second switching element with a dead time in between without particularly imposing limitation on an ON current value (a value of an electric current flowing in the second switching element in the ON state).

When the target output voltage of each of the legs 25 is within the predetermined voltage range as well, like the first control unit 10, the second control unit 10 generates the second control signal at a level (hereinafter described as level for current limitation) at which the ON current value is equal to or smaller than the specified current value and alternately turns on and off the first switching element and the second switching element without a dead time in between. However, when tuning on the second switching element, the second control unit 10 controls the current limitation circuit 26 such that the level of the second control signal (that is, the gate voltage of the second switching element) starts to rise in a rising pattern and at a rising start timing corresponding to the response speed of the current limitation circuit 26 and before an ON timing for the second switching element.

Figure 6A:
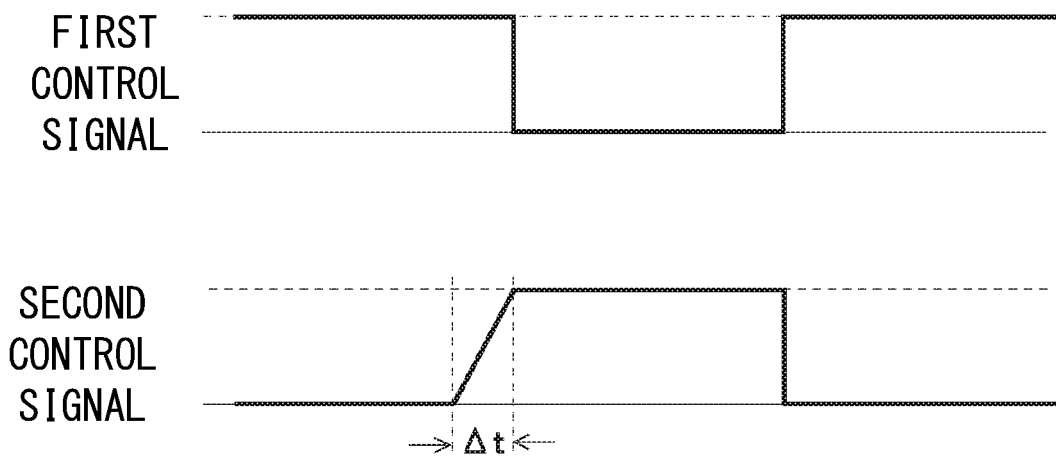
FIG. 6A is an explanatory diagram of a control example of a second control signal in a power conversion device according to a second embodiment of the present invention.
Figure 6B:
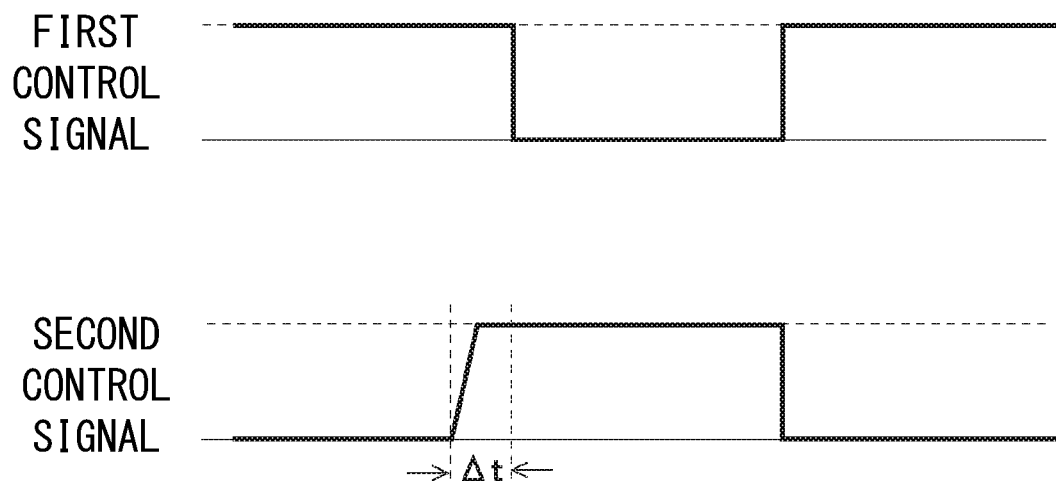
FIG. 6B is an explanatory diagram of a control example of the second control signal in the power conversion device according to the second embodiment.

Note that the rising pattern and the rising start timing corresponding to the response speed of the current limitation circuit 26 mean a rising pattern and rising start timing of the second control signal decided such that a value of an electric current flowing in the second switching element in the ON state even at the response speed of the current limitation circuit 26 in use is equal to or smaller than the specified current value. These parameters only have to be decided by a simulation or an experiment such that the ON current value is equal to or smaller than the specified current value even at the response speed of the current limitation circuit 26 in use. As illustrated in FIG. 6A, the rising pattern of the second control signal may be a rising pattern that rises at a fixed rate from the rising start timing (the ON timing−Δt for the second switching element) to the ON timing for the second switching element. As illustrated in FIG. 6B, the rising pattern of the second control signal may be a rising pattern in which the second control signal reaches the level for current limitation before the ON timing for the second switching element comes. Further, the rising pattern of the second control signal may be a rising pattern in which the rising rate changes according to time.

As explained above, when turning on the second switching element, the control unit 10 (the second control unit 10) of the power conversion device 20 according to this embodiment controls the current limitation circuit 26 such that the level of the second control signal starts to rise in the rising pattern and at the rising start timing corresponding to the response speed of the current limitation circuit 26 and before the ON timing for the second switching element. Therefore, the power conversion device 20 according to this embodiment functions as an device in which a short-circuit current exceeding the specified current value does not flow to each of the legs 25 even if the response speed of the current limitation circuit 26 of each of the legs 25 is low.

<<Modifications>>

Figure 7:
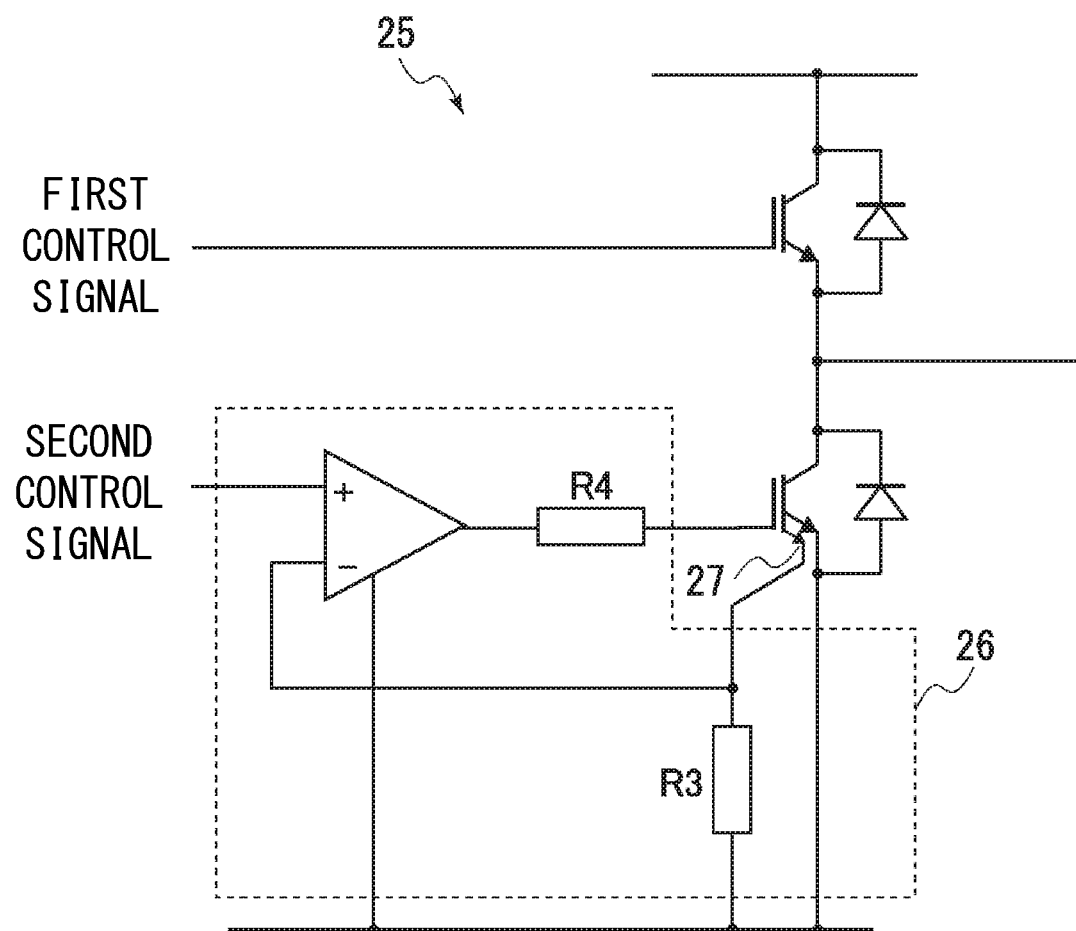
FIG. 7 is an explanatory diagram of a modification of the power conversion device according to the embodiment.

The power conversion device 20 explained above according to each of the embodiments can be variously modified. For example, the inverter circuit 24 of the power conversion device 20 according to each of the embodiments may be modified into an inverter circuit including the leg 25 having the circuit configuration illustrated in FIG. 7. That is, the inverter circuit 24 may be modified into an inverter circuit including the leg 25 in which a switching element with current sense is used as the second switching element, the current limitation circuit 26 that limits an electric current flowing in the second switching element on the basis of a value of an electric current flowing in a current sense terminal 27 of the second switching element being provided in the leg 25.

The control unit 10 of the power conversion device 20 according to each of the embodiments may be modified into a control unit that changes control content for each of the switching elements on the basis of a target output current rather than the target output voltage.

The current limitation circuit 26 detects, with the resistors R1 and R3, the electric current flowing in the switching element. However, as the current limitation circuit 26, a current limitation circuit that detects the electric current flowing in the switching element with another value that changes in accordance with the electric current may be adopted. Note that, as the other value, when the switching element is an FET, Vds can be illustrated. When the switching element is an IGBT or a transistor, Vce can be illustrated.

Figure 8:
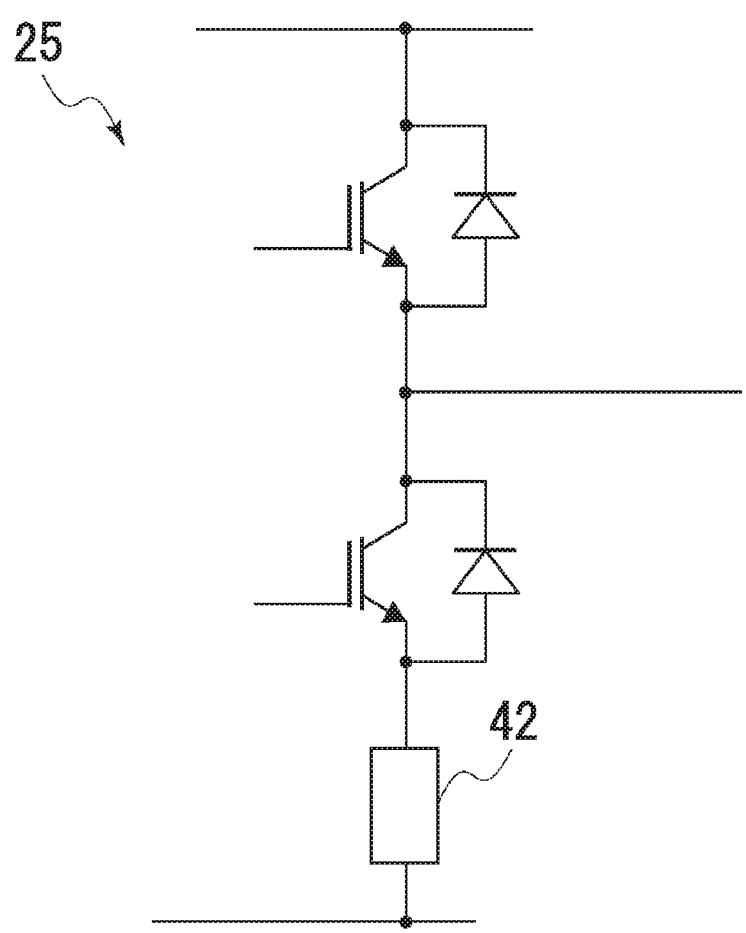
FIG. 8 is an explanatory diagram of a modification of the power conversion device according to the embodiment.

The current limitation circuit 26 explained above is a circuit that limits, according to control of the gate voltage of the second switching element (the IGBT), the electric current flowing in the leg. However, as schematically illustrated in FIG. 8, a current limitation circuit 42 may be provided in each of the legs 25 separately from the switching elements.

Figure 9:
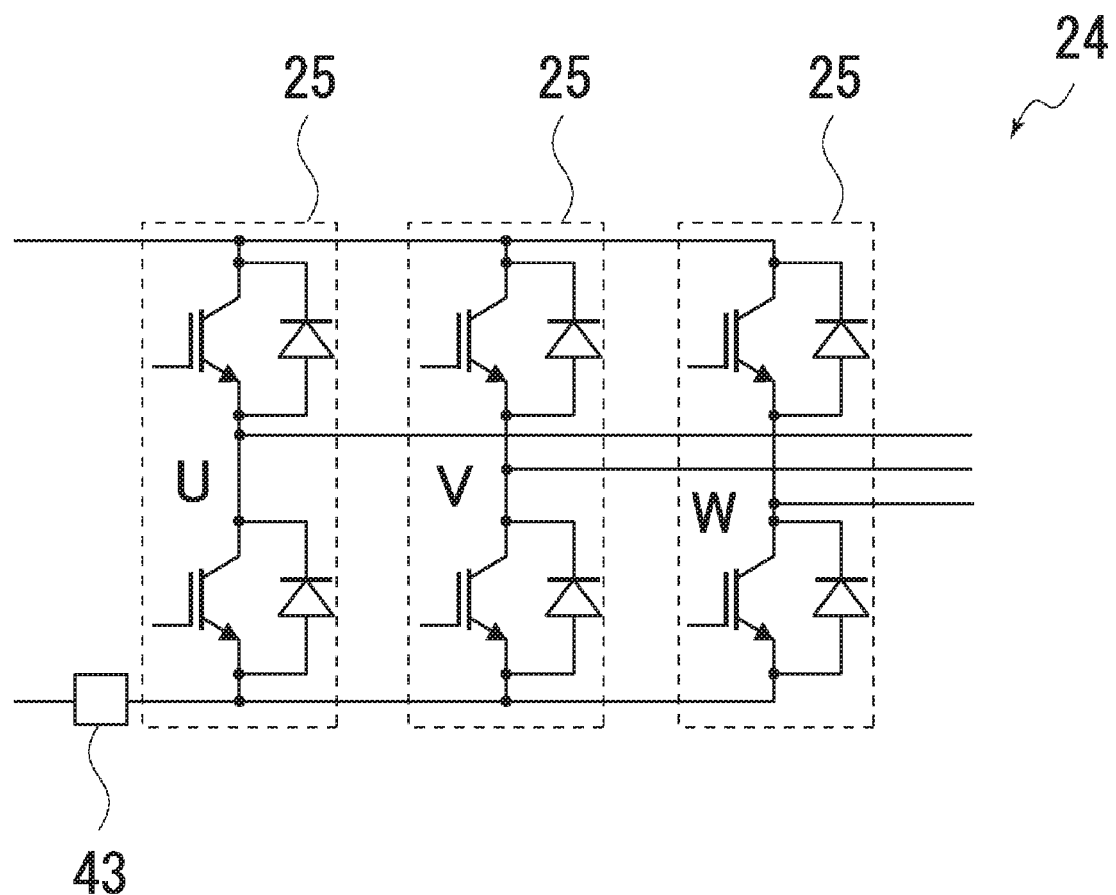
FIG. 9 is an explanatory diagram of a modification of the power conversion device according to the embodiment.

As schematically illustrated in FIG. 9, one current limitation circuit 43 may be provided in a bus of the inverter circuit 24.

Figure 10A:
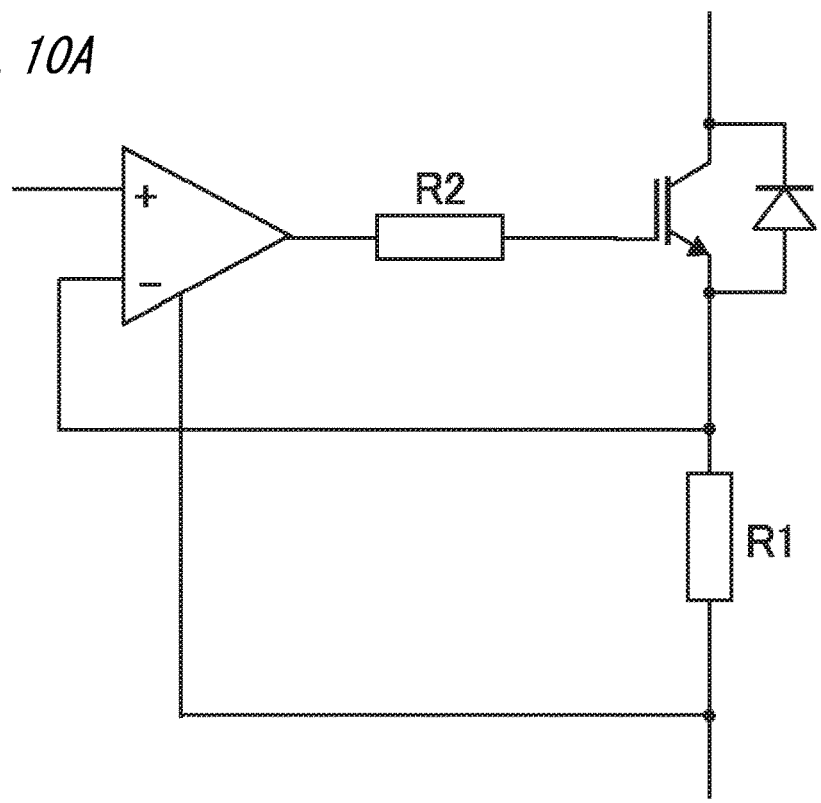
FIGS. 10A and 10B are explanatory diagrams of a circuit configuration example of a current limitation circuit that can be used in the power conversion device illustrated in FIG. 8 and FIG. 9.
Figure 10B:
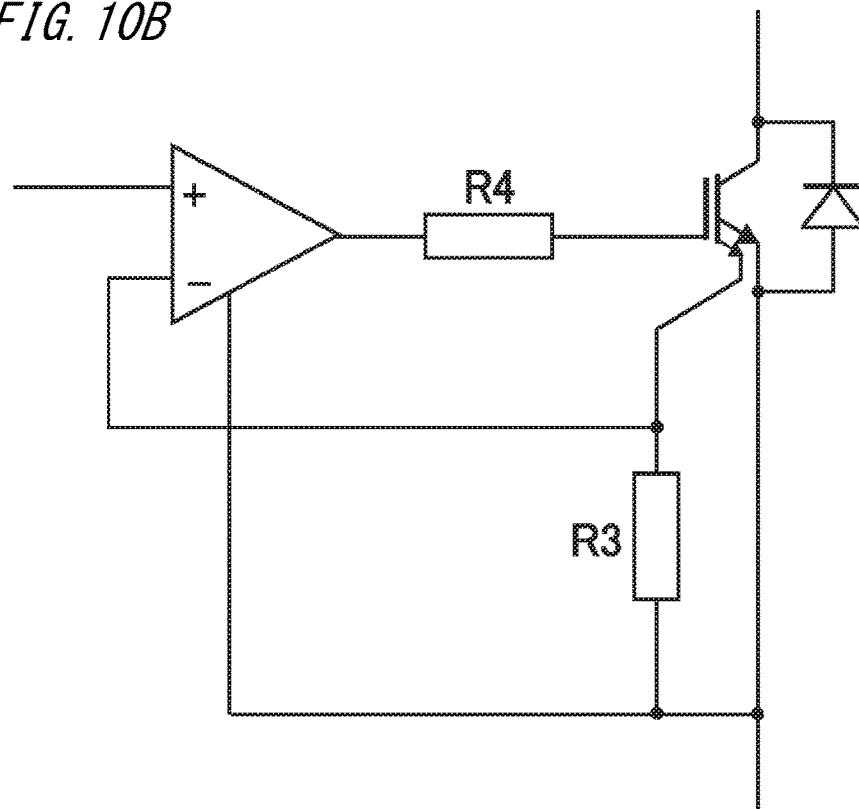

Note that, as the current limitation circuits 42 and 43 usable in the forms explained above, circuits having circuit configurations illustrated in FIGS. 10(A) and (B) can be illustrated. When the configuration illustrated in FIG. 8 or FIG. 9 is adopted, the control unit 10 only has to be a unit that controls, when the target voltage or the target current, which the control unit 10 should cause the inverter circuit 24 to output, is outside the predetermined range, each current limitation circuit 42 or current limitation circuit 43 such that an electric current flowing in each of the legs 25 is not limited and alternately performs ON/OFF control of the two switching elements of each of the legs 25 with a dead time in between and controls, when the target voltage or the target current is within the predetermined range, each current limitation circuit 42 or current limitation circuit 43 such that the electric current flowing in each of the legs 25 is limited and alternately performs ON/OFF control of the two switching elements of each of the legs 25 without a dead time in between.

The power conversion device 20 may be modified into an apparatus that supplies AC power to devices other than the motor 40 or an apparatus in which the number of the legs 25 in the inverter circuit 24 is not three. The power conversion device 20 may be modified into an apparatus in which a specific processing procedure is different from the processing procedure explained above (for example, an apparatus that changes rising and falling positions of a PWM pulse to insert a dead time).

<<Notes>>

(1) A power conversion device including:
an inverter circuit (24) including one or more legs (25) in which two switching elements are connected in series; and
a control unit (10) that performs ON/OFF control of each of the switching elements in the inverter circuit (24), wherein
one or a plurality of current limitation circuits (26; 42; 43) that limit an electric current flowing in each of the one or more legs are provided in the inverter circuit (24), and the control unit (10) controls, when a target voltage or a target current, which the control unit (10) should cause the inverter circuit (24) to output, is outside a predetermined range, the one or the plurality of current limitation circuits (26; 42; 43) such that the electric current flowing in each of the one or more legs (25) is not limited and alternately performs the ON/OFF control of the two switching elements of each of the one or more legs (25) of the inverter circuit (24) with a dead time in between and controls, when the target voltage or the target current is within the predetermined range, the one or the plurality of current limitation circuits (26; 42; 43) such that the electric current flowing in each of the legs one or more (25) is limited and alternately performs the ON/OFF control of the two switching elements of each of the one or more legs (25) of the inverter circuit (24) without the dead time in between.

(2) An inverter circuit (24) for converting DC power into AC power, the inverter circuit (24) including:
one or more legs (25) in which two switching elements are connected in series; and
one or a plurality of current limitation circuits (26; 42; 43) that limit an electric current flowing in each of the one or more legs (25), wherein when a target voltage or a target current which cause the inverter circuit (24) to output is outside a predetermined range, the one or the plurality of current limitation circuits (26; 42; 43) are controlled such that the electric current flowing in each of the one or more legs (25) is not limited and the ON/OFF control of the two switching elements of each of the one or more legs (25) of the inverter circuit (24) is alternately performed with a dead time in between, and when the target voltage or the target current is within the predetermined range, the one or the plurality of current limitation circuits (26; 42; 43) are controlled such that the electric current flowing in each of the one or more legs (25) is limited and the ON/OFF control of the two switching elements of each of the one or more legs (25) of the inverter circuit (24) is alternately performed without the dead time in between.

REFERENCE SIGNS LIST 10 control unit
20 power conversion device
21 power circuit
22 rectification circuit
23 smoothing capacitor
24 inverter circuit
25 leg
26, 42, 43 current limitation circuit
28 current sensor
30 host apparatus
33 current control unit
35 control-signal generating unit
40 motor
41 encoder
50 three-phase power supply

The invention claimed is:

1. A power conversion device comprising:
an inverter circuit including one or more legs in which two switching elements are connected in series; and
a control unit that performs ON/OFF control of each of the switching elements in the inverter circuit, wherein
one or a plurality of current limitation circuits that limit an electric current flowing in each of the one or more legs are provided in the inverter circuit, and
the control unit controls, when a target voltage or a target current, which the control unit should cause the inverter circuit to output, is outside a predetermined range, the one or the plurality of current limitation circuits such that the electric current flowing in each of the one or more legs is not limited and alternately performs the ON/OFF control of the two switching elements of each of the one or more legs of the inverter circuit with a dead time in between and controls, when the target voltage or the target current is within the predetermined range, the one or the plurality of current limitation circuits such that the electric current flowing in each of the one or more legs is limited and alternately performs the ON/OFF control of the two switching elements of each of the one or more legs of the inverter circuit without the dead time in between.

2. The power conversion device according to claim 1, wherein, for each of the one or more legs of the inverter circuit, the one or the plurality of current limitation circuits that limit the electric current flowing in each of the one or more legs is provided.

3. The power conversion device according to claim 2, wherein
the one or the plurality of current limitation circuits that limit the electric current flowing in each of the one or more legs are circuits that adjust a gate voltage or a base current of one switching element of a leg as a control target for an electric current to limit the electric current flowing in the leg, and the control unit controls, when the target voltage or the target current is within the predetermined range, the current limitation circuit such that the electric current flowing in the one switching element is equal to or smaller than a predetermined current when the one switching element is on and controls, when the target voltage or the target current is outside the predetermined range, the current limitation circuit such that the electric current flowing in the one switching element is not limited to the predetermined current or less when the one switching element is on.

4. The power conversion device according to claim 3, wherein, when the target voltage or the target current is within the predetermined range, when the one switching element is turned on, the control unit controls the current limitation circuit such that the gate voltage or the base current of the one switching element starts to rise in a rising pattern and at a rising start timing decided on the basis of response speed of the current limitation circuit and before an ON timing for the one switching element.

5. The power conversion device according to claim 3, wherein
the one switching element is a switching element with current sense, and
the current limitation circuit is a circuit that limits, on the basis of an electric current flowing in a current sense terminal of the one switching element, the electric current flowing in the leg.

6. An inverter circuit for converting DC power into AC power, the inverter circuit comprising:
one or more legs in which two switching elements are connected in series; and
one or a plurality of current limitation circuits that limit an electric current flowing in each of the one or more legs, wherein
when a target voltage or a target current which cause the inverter circuit to output is outside a predetermined range, the one or the plurality of current limitation circuits are controlled such that the electric current flowing in each of the one or more legs is not limited and the ON/OFF control of the two switching elements of each of the one or more legs of the inverter circuit is alternately performed with a dead time in between, and when the target voltage or the target current is within the predetermined range, the one or the plurality of current limitation circuits are controlled such that the electric current flowing in each of the one or more legs is limited and the ON/OFF control of the two switching elements of each of the one or more legs of the inverter circuit is alternately performed without the dead time in between.

7. The inverter circuit according to claim 6, wherein the one or the plurality of current limitation circuits that limit the electric flowing in each of the one or more legs are circuits provided in each of the one or more legs, the circuits adjusting a gate voltage or a base current of one switching element of each of the one or more legs to limit the electric current flowing in each of the one or more legs.

* * * * *